(12) United States Patent
Andry et al.

(10) Patent No.: US 6,731,064 B2
(45) Date of Patent: May 4, 2004

(54) YIELD ENCHANCEMENT PIXEL STRUCTURE FOR ACTIVE MATRIX ORGANIC LIGHT-EMITTING DIODE DISPLAYS

(75) Inventors: Paul S Andry, Mohegan Lake, NY (US); Peter M Fryer, Yorktown Heights, NY (US); Frank R Libsch, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/264,409

(22) Filed: Oct. 4, 2002

(65) Prior Publication Data

US 2003/0094894 A1 May 22, 2003

Related U.S. Application Data

(60) Provisional application No. 60/331,917, filed on Nov. 20, 2001.

(51) Int. Cl.[7] .................................................. H01J 1/62
(52) U.S. Cl. ........................................ 313/506; 313/498
(58) Field of Search ................................ 313/498, 504, 313/505, 506, 512

(56) References Cited

U.S. PATENT DOCUMENTS 6,150,668 A * 11/2000 Bao et al. .................... 313/504
6,262,441 B1 * 7/2001 Bohler et al. ................ 313/506

* cited by examiner

*Primary Examiner*—Vip Patel
(74) *Attorney, Agent, or Firm*—Ohlandt, Greeley, Ruggiero & Perle, L.L.P.; Robert M. Trepp

(57) ABSTRACT

An active matrix organic light-emitting diode comprising an organic light-emitting diode portion. The organic light-emitting diode portion comprising: an underlayer having a top surface and bottom surface; a first electrode layer which is deposited and patterned on the top surface of the underlayer such that at least a portion of the underlayer is exposed, wherein the deposited first electrode layer comprises a top surface, a bottom surface and sidewalls disposed between the top and bottom surfaces, the sidewalls are positioned adjacent to the exposed portion of the underlayer; a passivation layer deposited on the exposed portion of the underlayer and the peripheral regions of the first electrode layer such that the passivation layer covers the sidewalls and the peripheral regions of the first electrode layer; a transparent conductor layer deposited on the passivation layer and the non-peripheral regions of the first electrode layer; and a second electrode layer deposited on the transparent conductor layer.

24 Claims, 1 Drawing Sheet

YIELD ENHANCEMENT PIXEL STRUCTURE FOR ACTIVE MATRIX ORGANIC LIGHT-EMITTING DIODE DISPLAYS

This application is based upon and claims priority from U.S. Provisional Application No. 60/331,917, filed on Nov. 20, 2001.

The present invention is generally directed to active matrix organic light-emitting diode (AMOLED) displays which are enhanced by passivating the entire active array surface with an insulating layer, thereby substantially reducing or eliminating electrical shorts across the organic light-emitting diode (OLED) layer from the top electrode to the bottom electrode.

BACKGROUND OF THE INVENTION

AMOLED displays differ from active matrix liquid crystal diode (AMLCD) displays in a number of important ways, the most fundamental being that AMOLEDs are emissive type displays where the light emitted is generated by recombination of electrons and holes in a thin zone of the OLED material itself, whereas LCDs have a bright backlight as the light source, and each pixel is essentially a light valve, where grayscale is achieved by controlling the polarization state of the liquid crystal (LC) material relative to fixed polarizers attached in front of, and behind the LC sandwiched layer. This affords an AMOLED a number of advantages: there is no need for polarizers, backlight, color filter alignment (in the case of RGB OLED materials) or glue seal, and LC fill steps. As such, AMOLEDs can be made thin, and bright, with no viewing angle dependence or color shift problems associated with the electro-optical properties of AMLCDs.

Despite the myriad of advantages and the promise of tremendous commercial impact in the world of display technology, there remains a number of technical problems to solve before the full potential of AMOLED technology can be fully realized. One of these problems which is addressed by the present invention, arises because the entire OLED stack is usually quite thin (on the order of 100 nm) compared to the typical cell spacing in an AMLCD (about 5 um). This poses problems at the edges of the patterned electrodes, which themselves are typically 30 to 100 nm thick, depending on whether or not they are transparent or reflective. Transparent conductors such as ITO are typically wet-etched, and often have near vertical sidewalls which are very difficult to cover, especially when using small molecule OLED materials which are thermally evaporated, and thus have line-of-sight coating issues. In addition, many metals grow in a columnar fashion and also give near vertical sidewalls when wet-etched.

The present inventors have unexpectantly discovered that the aforementioned problems may be solved by passivating the entire active array surface with a final insulating layer, which, among other things, may include PECVD deposited SiOx, or SiNx, a spin-on insulating polymer film, etc. If such a layer is deposited, patterned and etched in such a way that the lower patterned electrode sidewall is completely coated, while a shallow taper angle is achieved at the point where the passivation layer meets the electrode surface, the possibility of electrical shorts across the OLED layer from the top electrode to the bottom is substantially eliminated or dramatically reduced. Therefore, one aim of the present invention is to electrically passivate the bottom electrode from the top electrode to prevent unintended shorting. Among other characteristics, this entails having an acceptable quality insulator.

Another aim of the present invention is to increase the chemical robustness during fabrication processing and after fabrication processing. Among other characteristics, this entails having an acceptable layer the provides: (1) acceptable selective etch ratio between the layer and the bottom electrode and underlying layers, (2) acceptable etch stop layer between the layer and subsequent layer processing, and (3) acceptable chemical barrier without being a source of element diffusion or degradation to the other film's properties.

Still another aim of the present invention is to increase, or at least not change, the optical efficiency of the subsequent OLED structure. Among other characteristics, this entails having an acceptable layer that provides either optical absorption or optical transparency.

The present invention also provides many additional advantages which shall become apparent as described below.

SUMMARY OF THE INVENTION

An active or passive matrix organic light-emitting diode comprising an organic light-emitting diode portion, the organic light-emitting diode portion comprising: an underlayer having a top surface and bottom surface; a first electrode layer which is deposited and patterned on the top surface of the underlayer such that at least a portion of the underlayer is exposed, wherein the deposited first electrode layer comprises a top surface, a bottom surface and sidewalls disposed between the top and bottom surfaces, the sidewalls are positioned adjacent to the exposed portion of the underlayer; a passivation layer deposited on the exposed portion of the underlayer and the peripheral regions of the first electrode layer such that the passivation layer covers the sidewalls and the peripheral regions of the first electrode layer; a transparent conductor layer deposited on the passivation layer and the non-peripheral regions of the first electrode layer; and a second electrode layer deposited on the transparent conductor layer.

Preferable, the first electrode layer is a pixel anode, the second electrode layer is a cathode, the transparent conductor layer is an organic light-emitting diode, and the passivation layer is at least one selected from the group consisting of: $SiO_x$, $SiN_x$, an insulating polymer material, or a combination thereof.

The passivation layer is preferably tapered toward the first electrode layer, such that a shallow taper angle is achieved at the point where the passivation layer meets the top surface of the first electrode.

The present invention also includes a method for forming an active matrix organic light-emitting diode comprising: (a) depositing and patterning a first electrode layer on the top surface of an underlayer such that at least a portion of the underlayer is exposed, wherein the deposited first electrode layer comprises a top surface, a bottom surface and sidewalls disposed between the top and bottom surfaces, the sidewalls are positioned adjacent to the exposed portion of the underlayer; (b) depositing a passivation layer on the exposed portion of the underlayer and the peripheral regions of the first electrode layer such that the passivation layer covers the sidewalls and the peripheral regions of the first electrode layer; (c) depositing a transparent conductor layer on the passivation layer and the non-peripheral regions of the first electrode layer; and (d) depositing a second electrode layer on the transparent conductor layer.

Other and further objects, advantages and features of the present invention will be understood by reference to the following specification in conjunction with the annexed drawings, wherein like parts have been given like numbers.

DESCRIPTION OF THE PREFERRED EMBODIMENTS

Figure 1:
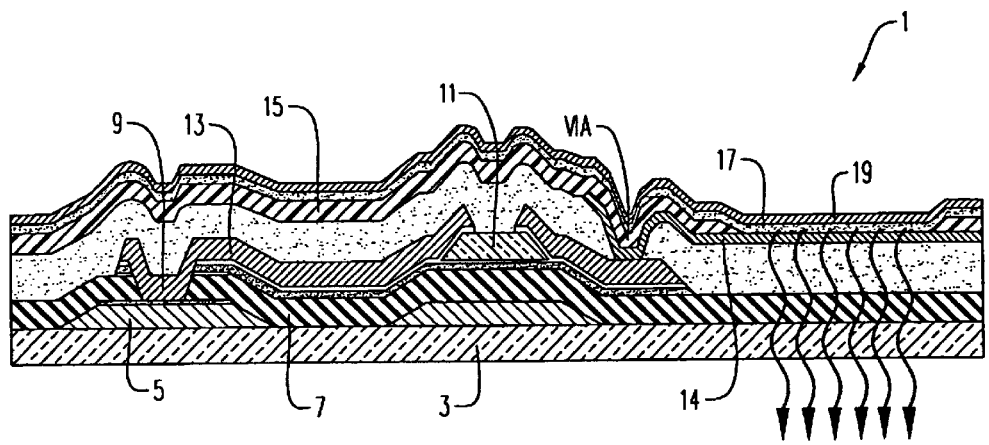
FIG. 1 is a cross-sectional view of part of an active matrix organic light-emitting diode (AMOLED) unit cell according to the present invention.

For reference, FIG. 1 shows the cross-section of part of a unit cell 1 comprising a current-drive thin film transistor (TFT) connected to an individual pixel in a bottom-emission AMOLED display. Unit cell 1 comprises a glass substrate 3 upon which is disposed a metal gate layer 5. Metal gate layer 5 has been patterned for a particular use and covered with gate insulator layer 7. A through hole 9 is formed in gate insulator 7 in proximity to gate metal 5. Etch stop 11 is disposed on gate insulator 7 in the area directly above gate metal 5 such that a data metal layer 13 is deposited upon gate insulator 7 in such a way that it fills through hole 9 and encapsulates etch stop 11. Data metal layer 13 is not deposited upon the two end portions of gate insulator 7. An ITO pixel anode 14 is then deposited over data metal layer 13, etch stop 11 and gate insulator 7 at opposite ends of cell 1. A final passivation layer 15 is deposited on ITO pixel anode 14. However, a portion of final passivation layer 15 is etched way above ITO pixel anode 14 on the right side of cell 1, such that an OLED layer 17 which is deposited on final passivation layer 15 comes into contact with ITO pixel anode 14 in the etched portion of final passivation layer 15. Prior to the OLED layer 17 deposition, the ITO or other anode electrode material may or may not receive a surface treatment to promote good hole carrier injection from the anode to the OLED layer. Finally, a common cathode 19 is deposited over OLED layer 17.

Figure 2A:
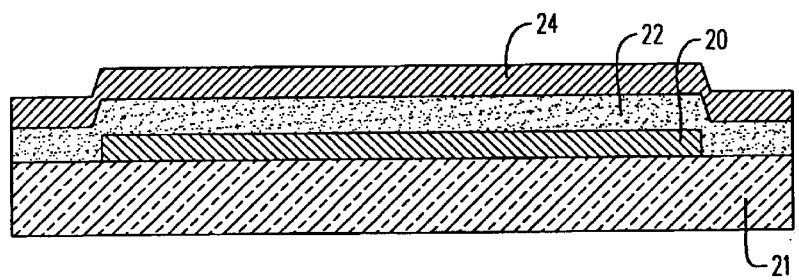
FIG. 2A is an organic light-emitting diode (OLED) stack with no edge passivation.

In FIG. 2A, patterned electrode 20, in this case the anode, disposed on a underlayer 21 is coated directly with the organic stack or OLED layer 22 by thermal evaporation, after which a common cathode 24 is deposited. (The cathode materials are low work function materials which readily oxidize, so that the OLED material and cathode are commonly deposited in a single pumpdown, after which the devices are off-loaded to an inert atmosphere, usually dry nitrogen or argon where they are encapsulated to prevent oxygen and moisture from attacking the cathode.) Because OLED stack 22 cannot be made arbitrarily thick, and because thermal evaporation gives very non-conformal coatings of vertical surfaces, the possibility of electrical shorting at the poorly coated electrode edge is very high. Electrical shorts not only result in a dark (dead) pixel, but the defect created at the shorted site tends to accelerate the cathode corrosion effect which can quickly spread to neighboring pixels, resulting in numerous dark spots across the display. In other fabrication sequences, the small molecule type OLED stack 22 may also be sputtered. Still further in other fabrication sequences, the OLED stack 22 may be of polymer type organic stack, and can be spun on. Sputtered or spun on OLED stacks also give non-conformal coatings or coating coverage thinning at electrode edges.

Figure 2B:
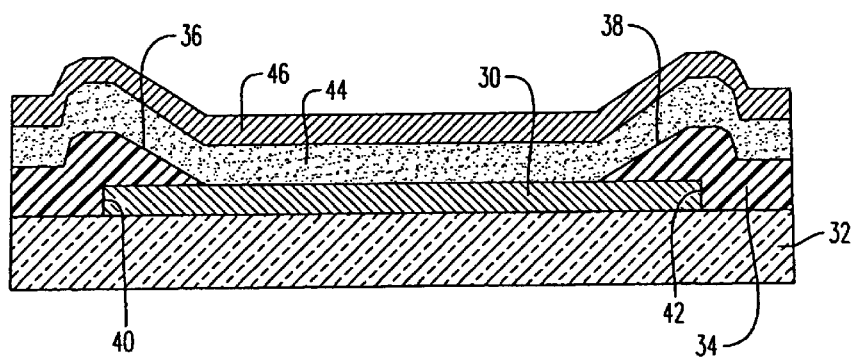
FIG. 2B is an organic light-emitting diode (OLED) stack with patterned edge passivation according to the present invention.

In FIG. 2B, patterned electrode 30 which is disposed upon underlayer 32 was first coated with a passivation layer 34, which was subsequently patterned such that its edge fell inside the pixel area of electrode 30. It was then etched in such a way that a uniform, shallow taper 36, 38 were propagated back towards the electrode edge 40, 42, respectively. OLED layer 44 and cathode layer 46 followed in exactly the same manner as in FIG. 2A. In this case, however, the electrically active area is now defined by the point at which passivation tapers 36, 38 meet patterned electrode 30, and since this is nicely tapered, there is almost no possibility of a short due to non-conformal coverage.

In practice, the tapered passivation layer may be achieved in a number of ways. A bilayer of PECVD SiNx was employed with a thickness range of 100 to 500 nm (ITO patterned electrodes were in the range of 2 to 50 nm thick, Ni patterned electrodes were in the range of 2 to 70 nm thick). The top 20 nm was composed of a faster-etching SiNx such that a controllable undercut, hence a desired taper angle, was achieved during etching. The "taper bilayer" may be etched in an HF solution, or using a low-power fluorinated plasma (or a combination of both if desired). PECVD has an advantage over evaporation or sputtering, in that PECVD films tend to be much more conformal, and hence are able to cover sidewalls much more effectively. Another choice for the passivation layer would be to use a photo-patternable planarizing polymer film (so-called "Polymer Film on Array" or PFA process) and use reflow to achieve a shallow taper angle down to the bottom electrode. Other materials are also possible.

In a typical OLED, one of the electrodes is transparent. Several sequences are possible. When the transparent electrode is the first electrode followed by the tapered passivation layer, the organic light emitting films and capped by a non transparent second electrode, such that a bottom emission AMOLED is fabricated. Conversely, a top emission AMOLED is fabricated when the first electrode is non transparent followed by the tapered passivation layer, the organic light emitting films and capped by a transparent second electrode. In both cases, the non transparent electrode may be either of absorbing properties or of reflective properties. The case where the non transparent electrode is of reflecting properties, produces a more electro to optically efficient AMOLED. Furthermore, there can be common anode or common cathode AMOLED configurations.

Furthermore, the cathode electrode is typically constructed of a low work function material, and is the source of electron injection from the cathode into the organic light emitting films. Examples of cathode electrode materials are high workfunction conductors, such as MgAg, Ca, and LiF. The holes are typically injected from a high work function anode material into the organic material. Examples of anode electrode materials are low workfunction conductors, such as indium tin oxide (ITO), indium zinc oxide (IZO), and Ni. The examples of transparent anode electrodes can be transparent ITO and IZO, or thin films (<200A) of Ni. The examples of transparent cathode electrodes can be thin films of MgAg, Ca, and LiF. Typically, a double layer cathode electrode is formed due to the need of passivating the reactive nature of these low work function materials and when a reflector electrode is desired. Since electron injection into the organic light emitting films is most critical for efficiency, the low work function conductor part of the double layer cathode is located adjacent to the organic light emitting films. Furthermore, the reactive nature of the cathode electrode material to air and moisture makes the placement of this electrode easiest and of highest yields when it is the second (top) electrode formed after the organic light emitting films. Still furthermore, the reactive nature of also the organic light emitting films to air and moisture makes the placement of oxygenated films, such as ITO and IZO anode electrodes, more desirable to be the first (bottom) electrode formed before the organic light emitting films. In still other fabrication sequence examples, the transparent electrodes transparency my require the electrode to be of a very thin (<200A) electrode thickness, where the resulting transparent electrical resistivity can be decreased by an additional grid or other repetitive structure formed by high conductivity, and typically non transparent, metal.

If in the fabrication sequence the bottom electrode is required to be transparent for maximizing the OLED layer emission of light outcoupling through the bottom, then the passivation layer 34 optical properties can be optimized by ensuring that the passivation layer allows maximum light outcoupling by incorporating a passivation layer 34 that: (1) is transparent to the OLED light wavelength intended to be emitted, (2) has a thickness approximately close to half the OLED light wavelength, or some whole integer thereof, and (3) does dielectric constant index matching to both interfaces it is in contact with, namely the bottom electrode and the OLED layer. However, if the fabrication sequence of the bottom electrode is required to be reflective for maximizing the OLED layer emission of light outcoupling through the top electrode, then the passivation layer 34 optical properties are optimized as above but with the bottom electrode being formed from a metal of high reflectivity that does not sacrifice the quality of carrier injection from the electrode to the OLED layer. Still further, if the fabrication sequence of the bottom electrode is required to be light absorbing for maximizing the OLED layer's contrast ratio through the top electrode, then the passivation layer 34 optical properties are tailored such that the passivation layer 34: (1) is opaque to the OLED light wavelengths, and (2) has a thickness approximately one-quarter the OLED light wavelength, or some whole integer thereof.

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications which come within the scope of the appended claims.

What is claimed is:

1. An active matrix organic light-emitting diode comprising an organic light-emitting diode portion, said organic light-emitting diode portion comprising:

an underlayer having a top surface and bottom surface;

a first electrode layer disposed on said top surface of said underlayer such that at least a portion of said underlayer is exposed, wherein said first electrode layer comprises a top surface, a bottom surface and sidewalls disposed between said top and bottom surfaces, said sidewalls are positioned adjacent to said exposed portion of said underlayer;

a passivation layer disposed on said exposed portion of said underlayer and the peripheral regions of said first electrode layer such that said passivation layer covers said sidewalls and said peripheral regions of said first electrode layer;

a transparent conductor layer deposited on said passivation layer and the non-peripheral regions of said first electrode layer; and a second electrode layer deposited on said transparent conductor layer.

2. The active matrix organic light-emitting diode according to claim 1, wherein said first electrode layer is a pixel anode.

3. The active matrix organic light-emitting diode according to claim 1, wherein said second electrode layer is a cathode.

4. The active matrix organic light-emitting diode according to claim 1, wherein said transparent conductor layer is an organic light-emitting diode.

5. The active matrix organic light-emitting diode according to claim 1, wherein said passivation layer is at least one selected from the group consisting of: $SiO_x$, $SiN_x$, an insulating polymer material, and a combination thereof.

6. The active matrix organic light-emitting diode according to claim 1, wherein said passivation layer is tapered toward said first electrode layer, such that a shallow taper angle is achieved at the point where said passivation layer meets the top surface of said first electrode.

7. The active matrix organic light-emitting diode according to claim 5, wherein said passivation layer is a bilayer of SiNx having a thickness in the range of between about 100 to 500 nm.

8. The active matrix organic light-emitting diode according to claim 1, wherein said first electrode layer is surface treated to promote good hole carrier injection from said first electrode layer to said transparent conductor layer.

9. The active matrix organic light-emitting diode according to claim 1, wherein said first electrode layer is transparent.

10. The active matrix organic light-emitting diode according to claim 1, wherein said passivation layer is transparent to the OLED light wavelength intended to be emitted, has a thickness about half that of the light wavelength of said organic light-emitting diode, and does dielectric constant index matching to both said first electrode layer and said transparent conductor layer.

11. The active matrix organic light-emitting diode according to claim 1, wherein said first electrode layer is formed from a metal of high reflectivity that does not sacrifice the quality of carrier injection from said first electrode layer to said transparent conductor layer.

12. The active matrix organic light-emitting diode according to claim 1, wherein said first electrode layer is light absorbing and said passivation layer is opaque to the light wavelengths of said organic light-emitting diode and has a thickness about one-quarter of the light wavelength of said organic light-emitting diode.

13. A method for forming an active matrix organic light-emitting diode comprising:

depositing and patterning a first electrode layer on said top surface of an underlayer such that at least a portion of said underlayer is exposed, wherein the deposited first electrode layer comprises a top surface, a bottom surface and sidewalls disposed between said top and bottom surfaces, said sidewalls are positioned adjacent to said exposed portion of said underlayer;

depositing a passivation layer on said exposed portion of said underlayer and the peripheral regions of said first electrode layer such that said passivation layer covers said sidewalls and said peripheral regions of said first electrode layer;

depositing a transparent conductor layer on said passivation layer and the non-peripheral regions of said first electrode layer; and depositing a second electrode layer on said transparent conductor layer.

14. The method according to claim 13, wherein said first electrode layer is a pixel anode.

15. The method according to claim 13, wherein said second electrode layer is a cathode.

16. The method according to claim 13, wherein said transparent conductor layer is an organic light-emitting diode.

17. The method according to claim 13, wherein said passivation layer is at least one selected from the group consisting of: $SiO_x$, $SiN_x$, an insulating polymer material, and a combination thereof.

18. The method according to claim 13, wherein said passivation layer is tapered toward said first electrode layer, such that a shallow taper angle is achieved at the point where said passivation layer meets the top surface of said first electrode.

19. The method according to claim 16, wherein said passivation layer is a bilayer of SiNx having a thickness in the range of between about 100 to 500 nm.

20. The method according to claim 13, further comprising: treating the surface of said first electrode layer to promote good hole carrier injection from said first electrode layer to said transparent conductor layer.

21. The method according to claim 13, wherein said first electrode layer is transparent.

22. The method according to claim 13, wherein said passivation layer is transparent to the OLED light wavelength intended to be emitted, has a thickness about half that of the light wavelength of said organic light-emitting diode, and does dielectric constant index matching to both said first electrode layer and said transparent conductor layer.

23. The method according to claim 13, wherein said first electrode layer is formed from a metal of high reflectivity that does not sacrifice the quality of carrier injection from said first electrode layer to said transparent conductor layer.

24. The method according to claim 13, wherein said first electrode layer is light absorbing and said passivation layer is opaque to the light wavelengths of said organic light-emitting diode and has a thickness about one-quarter of the light wavelength of said organic light-emitting diode.

* * * * *